US006818822B1

United States Patent
Gilliland et al.

(10) Patent No.: US 6,818,822 B1
(45) Date of Patent: Nov. 16, 2004

(54) CONDUCTIVE GASKET INCLUDING INTERNAL CONTACT-ENHANCING STRIP

(75) Inventors: Don Alan Gilliland, Rochester, MN (US); Max John Christopher Koschmeder, Oronoco, MN (US); Cary Michael Huettner, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/821,145

(22) Filed: Apr. 8, 2004

(51) Int. Cl.[7] ................................................ H05K 9/00
(52) U.S. Cl. .................... 174/35 GC; 277/920
(58) Field of Search .................. 174/35 R, 35 GC; 361/816, 818; 277/920

(56) References Cited

U.S. PATENT DOCUMENTS

| 5,506,514 | A |   | 4/1996 | Difrancesco |
| 5,578,790 | A | * | 11/1996 | Peregrim ............... 174/35 GC |
| 6,224,396 | B1 |   | 5/2001 | Chan et al. |
| 6,355,878 | B1 | * | 3/2002 | Kim ....................... 174/35 GC |
| 6,462,267 | B1 | * | 10/2002 | Spies et al. ............. 174/35 GC |
| 6,541,698 | B2 | * | 4/2003 | Miska .................... 174/35 GC |
| 6,653,556 | B2 | * | 11/2003 | Kim ....................... 174/35 GC |
| 6,670,545 | B2 | * | 12/2003 | Botrie .................... 174/35 GC |

FOREIGN PATENT DOCUMENTS

| JP | 3108400 A | 5/1991 |
| JP | 10027984 A | 1/1998 |
| JP | 10190277 A | 7/1998 |
| JP | 11129377 A | 5/1999 |

* cited by examiner

Primary Examiner—Hung V. Ngo
(74) Attorney, Agent, or Firm—Weiss, Moy & Harris, PC

(57) ABSTRACT

A novel conductive gasket including an internal contact-enhancing strip provides improved contact performance in electromagnetic interference prevention and other applications. A metal mesh or conductive plastic covers a substantially rigid internal strip that includes protrusions that either bend or penetrate the gasket cover in order to enhance contact with another conductive surface. The cover may include holes aligned with the protrusions so that the protrusions pass through the holes when the gasket is compressed, or the protrusions may penetrate a mesh or plastic cover. An internal foam piece may be provided behind the internal strip to restore the shape of the when compressive force is removed and a second internal foam piece may be provided between the strip and the cover for maintaining the shape of the gasket. The protrusions on the internal strip may range from needle-shaped protrusions for puncturing a coating to relatively smooth bumps for bending the surface of the cover when the gasket is compressed.

20 Claims, 3 Drawing Sheets

CONDUCTIVE GASKET INCLUDING INTERNAL CONTACT-ENHANCING STRIP

BACKGROUND OF THE INVENTION

1. Field of the Invention

The present invention relates generally to conductive gaskets for shielding against electromagnetic interference (EMI gaskets), and more particularly, to a conductive gasket having improved performance when providing contact through non-conductive coatings.

2. Background Information

Conductive gaskets are widely used to prevent electromagnetic interference (EMI) leakage and entrance into and from electronic equipment. In particular, EMI gaskets are provided at the interfaces of computer cabinets and cabinets containing other electronic equipment so that radiated emissions fall below maximum radiated emissions requirements of various authorities such as the U.S. Federal Communications Commission (FCC) standards and Canadian Standards Association (CSA).

Typically, a wire mesh gasket including an internal foam material is provided on flanges and other interfaces of cabinets having exposed conductive surfaces. When the cabinet is closed, the gaskets are compressed providing a low-impedance contact between cabinet portions via the conductive wire mesh.

However, non-conductive coatings such as organic anti-fingerprint coatings are often used on equipment surfaces in order to provide improved appearance and to avoid oxidation initiated by contact with acids transferred from human skin. In addition, such coatings prevent oxidation occurring naturally on exposed metal surfaces that do not have anti-corrosion platings. When a gasket, or the surface that a gasket is to contact is coated with such a material, the surface conductivity may be dramatically reduced, requiring removal of the coating before a sufficiently low-impedance contact may be made with the gasket.

Also, in general, as frequencies of electronic equipment (in particular digital computing systems) continue to increase, improved shielding is necessary, and therefore the performance of conductive gaskets becomes more critical.

Therefore, it would be desirable to provide a conductive gasket and method of manufacture for a conductive gasket having improved performance, and in particular a conductive gasket that will operate reliably when either the gasket or a mating surface is coated with a non-conductive coating.

SUMMARY OF THE INVENTION

The objective of providing improved conductive gasket performance, particularly in the presence of non-conductive coatings, is accomplished in a new conductive gasket and method of manufacture.

The gasket includes a contact strip provided beneath a flexible conductive cover. The cover may be a conductive wire mesh, or alternatively, a flexible plastic with a conductive coating on an exterior surface. The contact strip includes multiple protrusions that may pass through the cover when the gasket is compressed, providing improved contact with the surface that the protrusions contact and penetration of any non-conductive coating that is present. Holes may also be provided in a flexible plastic cover so that protrusions may pass through without damaging the cover.

Alternatively, the protrusions may be relatively smooth projections or bends in the contact strip that cause the flexible cover to bend sharply, providing corners in the cover that will break through any non-conductive coating that is present. The gasket may include a foam insert to restore the shape of the gasket when a compressive force is removed. A foam section may be included above the protrusions in order to preserve the shape of the gasket. Or, the gasket may be made entirely from a wire mesh with a contact strip woven inside. The contact strip may include protrusions on both faces so that contact is enhanced with two surfaces when the gasket is compressed.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DETAILED DESCRIPTION OF THE PREFERRED EMBODIMENTS

The invention will now be described in more detail by way of example with reference to the embodiments shown in the accompanying figures. It should be kept in mind that the following described embodiments are only presented by way of example and should not be construed as limiting the inventive concept to any particular physical configuration.

Further, if used and unless otherwise stated, the terms "upper," "lower," "front," "back," "over," "under," and similar such terms are not to be construed as limiting the invention to a particular orientation. Instead, these terms are used only on a relative basis.

Figure 1A:
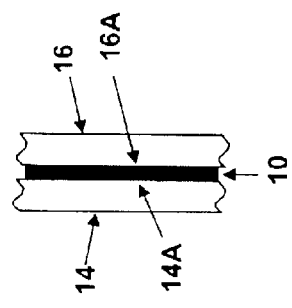
FIG. 1A is a pictorial diagram depicting an open electronics cabinet including a gasket in accordance with an embodiment of the present invention.

With reference now to the figures, and in particular with reference to FIG. 1A, there is depicted an electronics cabinet 12 including an EMI gasket 10 in accordance with an embodiment of the present invention. Gasket 10 is installed on a flange 14 of cabinet 12 on which a cover (not shown) will be mounted. Gasket 10 provides a low-impedance connection between a cover and flange 14 so that electronics 16 is shielded from outside EMI and also reduces emissions from electronics 16 into the environment outside of cabinet 12. While the installation of FIG. 1A shows a typical use of an EMI gasket, gasket 10 is atypical, as gasket 10 includes improvements as will be detailed in the description below.

Figure 1B:
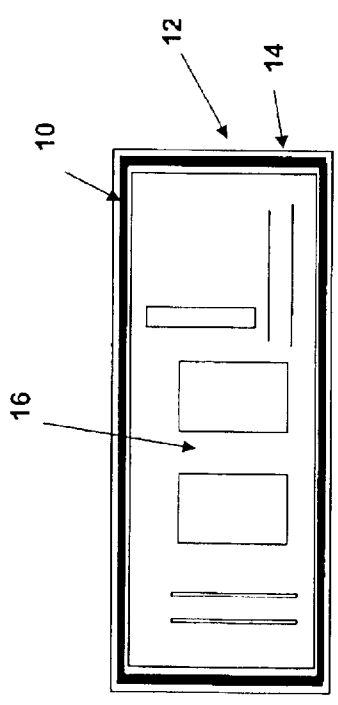
FIG. 1B is a pictorial diagram depicting further details of the cabinet and gasket of FIG. 1A.

FIG. 1B illustrates installation details of gasket 10, including the contact of gasket 10 with a first surface 16A of cover 16 as well as a second surface 14A of flange 14 to which gasket 10 is attached via an adhesive or other mounting mechanism. Contact of first surface 16A with gasket 10 is a pressure contact that provides the electrical path from gasket 10 to cover 16 so that a highly conductive path is established through gasket 10 from cover 16 to flange 14. Gasket 10 includes improvements detailed herein below, that aid in providing a highly conductive (low-impedance) path between two or more surfaces. In particular, if any of surfaces 14A or 16A, as well as the surfaces of gasket 10 are coated with a non-conductive coating, such as anti-fingerprint organic coatings or anti-oxidation coatings, gasket 10 includes features such that when gasket 10 is compressed, the coatings will be penetrated and a highly-conductive path established between the mating surfaces contacting the gasket.

In general, the surface to which gasket 10 is mounted will be conductive, and the surface of gasket 10 and the opposing surface to be contacted by gasket 10 will be coated and the surface of gasket may be coated as well. However, certain embodiments of gasket 10 that will be illustrated in detail below, are designed to penetrate non-conductive coatings at two or more surfaces of gasket 10 when gasket 10 is compressed.

Figure 2A:
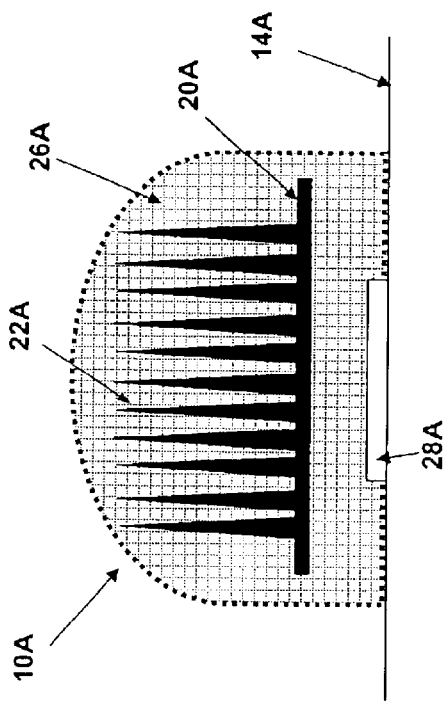
FIGS. 2A–2D are pictorial diagrams depicting cross-sectional views of gaskets in accordance with various embodiments of the present invention.

Referring now to FIG. 2A, details of gasket 10 are illustrated. Gasket 10 includes an outer conductive cover 26 in the form of a wire mesh, as is well known in the art of electromagnetic shielding gaskets. Within gasket 10, a foam core 24 is introduced in order to shape wire mesh cover 26 into a D-shaped cross-section. Also within gasket 10 a conductive metal strip 20 including a plurality of protrusions 22 is located so that when gasket 10 is compressed, protrusions 22 protrude through cover 26, penetrating any coating present on a surface that contacts the top surface of gasket 10.

The bottom surface of gasket 10 is electrically coupled to the mounting surface 14A by a conductive adhesive 28, so that a conductive path is established between mounting surface 14A, cover 26, metal strip 20 and protrusions 22. The combination of the electrically interconnected components listed above yield a very low-impedance path between surface 14A and a surface placed in pressure contact with protrusions 22 and cover 26. Alternative conduction mechanisms are possible and particular conduction mechanisms are illustrated herein below. Also, foam 24 may be a conductive foam, further reducing the impedance of the connection between metal strip 20 and surface 14A. Protrusions 22 are generally of sufficient sharpness to provide for penetrations of surface coatings, but not so sharp as to pose an installation or handling hazard to persons handling or installing gasket 10.

While most of the embodiments depicted herein are illustrated as having a D-shaped gasket cross-section, it will be understood that gaskets are supplied in a variety of shapes and sizes, and that the techniques of the present invention can be applied to other gasket shapes such as cylindrical, rectangular and hemispherical cross-sections.

Figure 2B:
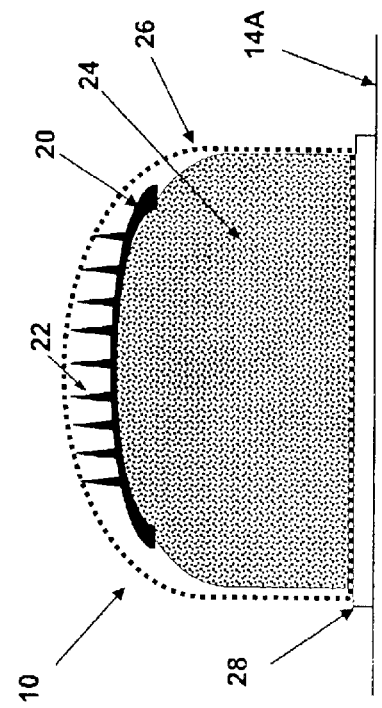

Referring now to FIG. 2B, details of a gasket 10A in accordance with another embodiment of the present invention are illustrated. Gasket 10A has a body formed from a wire mesh 26A, as is well known in the art of electromagnetic shielding gaskets. Within gasket 10, a conductive metal strip 20A including a plurality of protrusions 22A is located so that when gasket 10A is compressed, protrusions 22 protrude through the top surface of wire mesh 26A, penetrating any coating present on a surface that contacts the top surface of gasket 10A.

The bottom surface of gasket 10A is mechanically attached to mounting surface 14A by an adhesive strip 28A, but the conductive path that is established between mounting surface 14A, wire mesh 26A, metal strip 20A and protrusions 22A is provided by contact of wire mesh 26A. The mounting arrangement shown, which is particularly suited to mounting via a double-sided adhesive strip that is non-conductive may also replace the illustrated mounting configurations depicted in the other illustrated embodiments and is shown here as an alternative mounting arrangement. The embodiment depicted in FIG. 2B illustrates a conductive gasket in accordance with the present invention that does not require an internal foam insert, as the shape of gasket 10A is maintained by solid wire mesh body 26A.

Figure 2C:
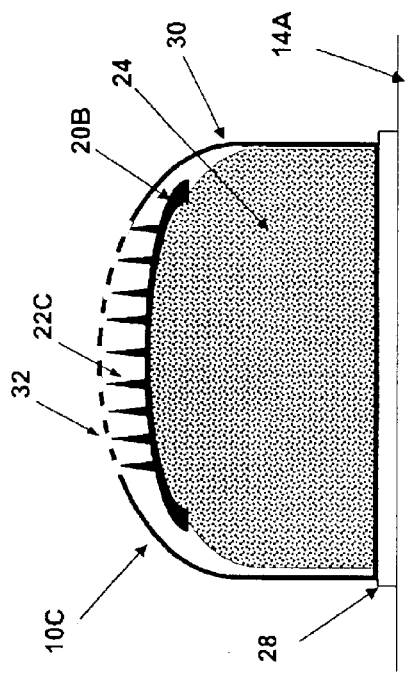

Referring now to FIG. 2C, details of a gasket 10B in accordance with yet another embodiment of the present invention are illustrated. Gasket 10B is similar to gasket 10 of FIG. 2A, but is designed so that protrusions 22B extend through cover 26B, even when gasket 10B is uncompressed. When gasket 10B is compressed, protrusions 22 protrude further through the top surface of wire mesh 26B, penetrating any coating present on a surface that contacts the top surface of gasket 10B.

Figure 2D:
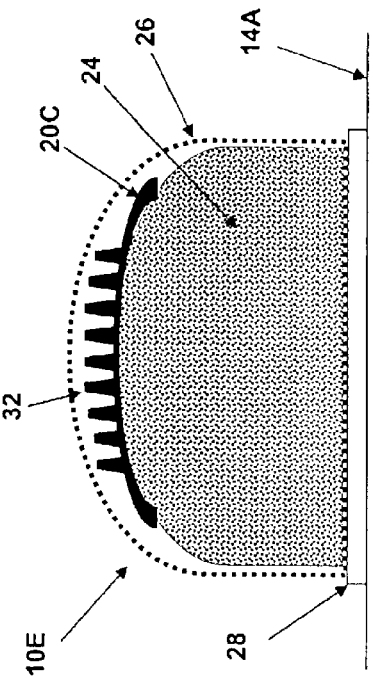

Referring now to FIG. 2D, details of a gasket 10C in accordance with still another embodiment of the present invention are illustrated. Gasket 10B is similar to gasket 10 of FIG. 2A, but cover 30 is a flexible plastic cover, which is generally a sputtered metal film. Perforations 32 may be pre-made in cover 30 and aligned with protrusions 22C (or protrusions 22C may self-align) so that cover 30 is not altered when gasket 10C is compressed. Alternatively, in some applications such as for one-time installation, cover 30 may be made without perforations and may be perforated by protrusions 22C when gasket 10C is compressed.

Figure 3A:
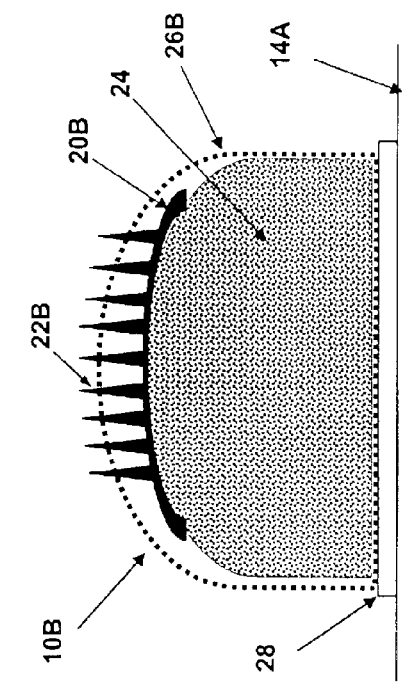
FIG. 3A is a pictorial diagram depicting a side cross-sectional view of a gasket in accordance with another embodiment of the present invention.

Referring now to FIG. 3A, another gasket 10D is illustrated. Gasket 10D is similar to gasket 10B of FIG. 2C, but includes a foam section 24A that preserves the shape of outer conductive cover 26 above contact strip 20B, which is formed form a wire mesh. Within gasket 10D, foam core 24 also holds the shape of outer conductive cover 26 to produce a D-shaped cross-section. All other features are as described above for gasket 10B. Foam section 24A may be conductive or non-conductive and may be of the same as or may be of a material differing from that of foam core 24.

Figure 3B:
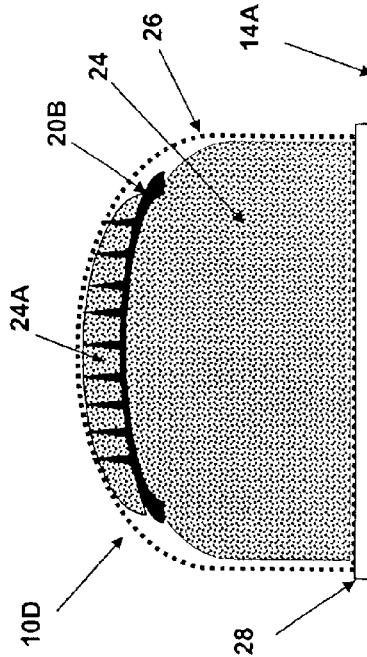
FIG. 3B is a pictorial diagram depicting a side cross-sectional view of a gasket in accordance with an alternative embodiment of the present invention.

Referring now to FIG. 3B, a cross-sectional view of a conductive gasket 10E in accordance with an alternative embodiment of the invention is depicted. Gasket 10E includes a strip 20C that includes blunt protrusions 32 that do not penetrate gasket cover 26 when gasket 10E is compressed. However, protrusions 32 cause the surface of cover 26 to bend sharply, when gasket 10E is compressed, causing a break in any coating deposited on conductive cover 26. Alternatively, bends or other shapes may be provided on contact strip 20C as long as the bending requirement is satisfied. Strip 20C is backed with a conductive or non-conductive foam 24 and is coupled electrically to surface 14A by electrical contact with cover 26, or via a conductive adhesive strip as described above. In the embodiment of FIG. 3B strip 20C does not have to be a metal conductive strip, but only have sufficient stiffness to cause sharp bending of gasket cover 26 surface when gasket 10E is compressed.

Figure 4:
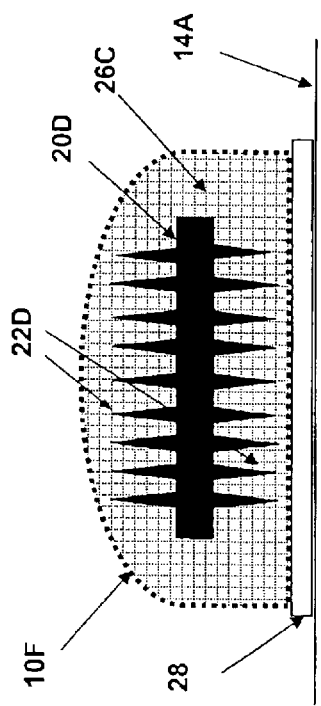

Referring now to FIG. 4, another gasket 10F in accordance with an embodiment of the invention is shown. Gasket 10F includes a metal contact strip 20D having protrusions 22D located on both a top and a bottom side. Providing protrusions 22D on both sides of a gasket permits penetration of coatings on two gasket faces, or even penetration of an adhesive layer 28 when gasket 10F is compressed. A wire mesh body 26C is shown surrounding metal contact strip 20D, but other forms of gaskets such as the foam and plastic cover embodiments described above may be adapted to include a double-sided contact strip such as metal contact strip 20D.

Figure 5:
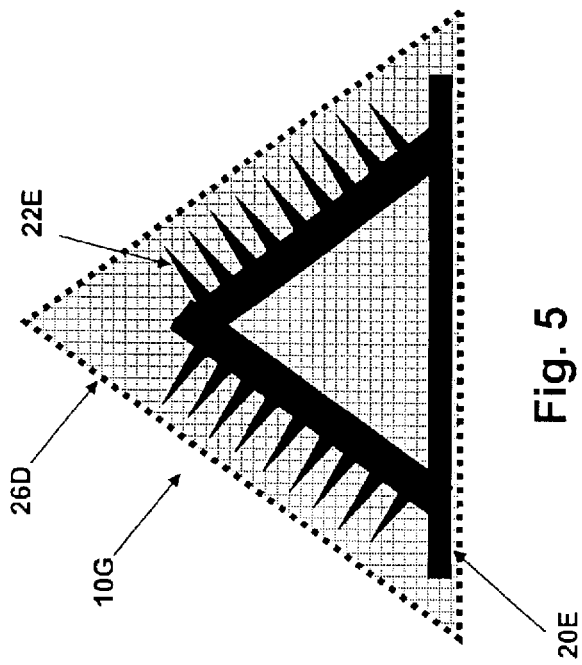
FIGS. 4–6 are pictorial diagrams depicting cross-sectional views of gaskets in accordance with other embodiments of the present invention.

Referring now to FIG. 5, another gasket 10G in accordance with an embodiment of the invention is shown. Gasket 10G includes a metal contact strip 20E having protrusions 22E located on two faces beneath wire mesh body 26D and a protrusion-less third bottom face (optional) for support. Without the bottom face, contact strip 20E may be formed as a single strip and then bent at the apex. Gasket 10G provides a conductive path between two or three surfaces for corners of cabinets.

Figure 6:
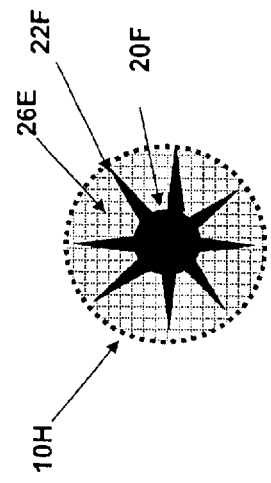

Referring now to FIG. 6, another gasket 10H in accordance with another embodiment of the invention is shown. Gasket 10H is a cylindrical gasket, as is often required for channel mounting. Gasket 10H includes a metal contact strip 20F in the form of a wire or rod 20F having protrusions 22F extending radially from the wire or rod 20F and surrounded by a metal mesh 26E. When gasket 10H is compressed along a given radius, protrusions 22F extending along that radius will penetrate mesh 26E and provide improved conduction, penetrating any non-conductive coatings contacted by protrusions 22F.

It should be understood, however, that the invention is not necessarily limited to the specific process, arrangement, materials and components shown and described above, but may be susceptible to numerous variations within the scope of the invention.

It will be apparent to one skilled in the art that the manner of making and using the claimed invention has been adequately disclosed in the above-written description of the preferred embodiments taken together with the drawings.

It will be understood that the above description of the preferred embodiments of the present invention are susceptible to various modifications, changes and adaptations, and the same are intended to be comprehended within the meaning and range of equivalents of the appended claims.

What is claimed is:

1. A conductive gasket for providing a low-impedance contact between a first surface and a second surface, said gasket comprising:
   a flexible cover for contacting the first surface on an exterior face of said conductive cover when said gasket is compressed;
   a contact strip disposed on an anterior face of the conductive cover and having a plurality of protrusions disposed thereon for improving contact between said gasket and said first surface when said gasket is compressed; and
   a conductive path between said second surface and at least one of said flexible cover and said contact strip for providing a low-impedance path between said first surface and said second surface when said gasket is compressed.

2. The conductive gasket of claim 1, wherein said contact strip is a metal contact strip and said protrusions are conductive projections from an exterior face of said contact strip facing said anterior face of the conductive cover, and wherein said conductive projections pass through said flexible cover when said gasket is compressed.

3. The conductive gasket of claim 2, wherein said conductive cover is a wire mesh, whereby said conductive projections pass through said wire mesh by displacing said wire mesh when said gasket is compressed.

4. The conductive gasket of claim 2, wherein said protrusions extend through said conductive cover when said gasket is uncompressed and pass further through said flexible cover when said gasket is compressed.

5. The conductive gasket of claim 2, wherein said flexible cover includes a plurality of perforations therethrough and aligned with said projections, whereby said conductive projections pass through said perforations when said gasket is compressed.

6. The conductive gasket of claim 2, wherein said flexible cover is a flexible plastic strip having a conductive coating on at least said exterior surface.

7. The conductive gasket of claim 1, further comprising a compressible foam layer disposed on an anterior face of said contact strip facing away from said anterior face of said flexible cover for applying force to said contact strip when said gasket is compressed.

8. The conductive gasket of claim 7, further comprising a second compressible foam layer disposed on an exterior face of said contact strip between said contact strip and said flexible cover for maintaining a shape of said gasket.

9. The conductive gasket of claim 1, wherein said compressible foam layer is a conductive foam layer, and wherein said conductive path is provided by contact between said contact strip and said second surface via contact between said contact strip and said conductive foam and further provided by contact between said conductive foam and said second surface.

10. The conductive gasket of claim 1, wherein said protrusions bend said flexible cover, but do not penetrate said flexible cover when said gasket is compressed, whereby electrical contact with said first surface is improved by bends in said flexible cover.

11. The conductive gasket of claim 1, wherein said conductive path is provided by contact between said contact strip and said second surface.

12. The conductive gasket of claim 1, wherein said flexible cover is a conductive cover, and wherein said conductive path is provided by contact between said cover and said second surface.

13. The conductive gasket of claim 1, wherein said contact strip is a metal contact strip and said protrusions are conductive projections extending from both an exterior face and an anterior face of said contact strip, wherein said conductive projections pass through said flexible cover when said gasket is compressed, and wherein said protrusions extending from said anterior face provide at least a portion of said conductive path via contact with said second surface.

14. The conductive gasket of claim 1, wherein said contact strip is a first metal contact strip, said protrusions are first conductive projections extending from an exterior face of said contact strip, wherein said first conductive projections pass through said flexible cover when said gasket is compressed, and further comprising:
   a second metal contact strip disposed at a predetermined angle greater than zero in an axis perpendicular to a longitudinal extension of said gasket and having second conductive projections disposed on an exterior face thereof, wherein said flexible cover is further disposed over said second metal contact strip, and wherein said second conductive projections pass through said flexible cover to contact said second surface when said gasket is compressed.

15. The conductive gasket of claim 1, wherein said contact strip is in the form of a cylindrical conductor, and wherein said protrusions extend radially from a central axis of said cylindrical conductor.

16. A conductive gasket for providing a low-impedance contact between a first surface and a second surface, said gasket comprising:

a wire mesh cover for contacting the first surface on an exterior face of said conductive cover when said gasket is compressed;

a contact strip disposed on an anterior face of the conductive cover and having a plurality of protrusions disposed thereon for penetrating said wire mesh cover when said gasket is compressed;

a first compressible foam layer disposed on an anterior face of said contact strip facing away from said anterior face of said flexible cover for applying force to said contact strip when said gasket is compressed;

a second compressible foam layer disposed on an exterior face of said contact strip between said contact strip and said wire mesh cover for maintaining a shape of said gasket; and a conductive path between said second surface said flexible cover, whereby a low impedance is established between said second surface, said wire mesh cover and said contact strip when said gasket is compressed.

17. A method for manufacturing a conductive gasket, said method comprising:

forming a contact strip having a plurality of protrusions disposed thereon for improving electrical contact of said gasket when said gasket is compressed; and covering said contact strip with a flexible cover to form said gasket, whereby said protrusions pass through said flexible cover when said gasket is compressed.

18. The method of claim 17, wherein said covering comprises wrapping a wire mesh cover around said contact strip.

19. The method of claim 17, further comprising placing said contact strip over a compressible foam layer prior to said covering, and wherein said covering covers said compressible foam layer and said contact strip.

20. The method of claim 17, further comprising forming perforations in said flexible cover prior to said covering, whereby said protrusions pass through said perforations in said cover.

* * * * *